(12) United States Patent
Choi

(10) Patent No.: US 6,873,194 B2
(45) Date of Patent: Mar. 29, 2005

(54) CHARGE PUMP INCLUDING A FEEDBACK DEVICE FOR USE IN A PHASE-LOCKED LOOP

(75) Inventor: Ka Lun Choi, Laguna Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/781,822

(22) Filed: Feb. 20, 2004

(65) Prior Publication Data

US 2004/0160249 A1 Aug. 19, 2004

Related U.S. Application Data

(63) Continuation of application No. 09/956,114, filed on Sep. 20, 2001.
(60) Provisional application No. 60/235,725, filed on Sep. 27, 2000.

(51) Int. Cl.[7] ............................................... H03L 7/06
(52) U.S. Cl. ........................................ 327/157; 327/563
(58) Field of Search ................................ 327/157, 563, 327/103

(56) References Cited

U.S. PATENT DOCUMENTS

| | | |
|---|---|---|
| 3,564,439 A | 2/1971 | Rao |
| 3,641,450 A | 2/1972 | Lunn |
| 5,382,917 A | 1/1995 | Miyake et al. |
| 5,625,307 A | 4/1997 | Scheinberg |
| 5,668,502 A | 9/1997 | Rijns |
| 5,828,265 A | 10/1998 | Mensink et al. |
| 5,859,559 A | 1/1999 | Hong et al. |
| 5,901,350 A | 5/1999 | Stoichita et al. |
| 6,275,097 B1 * | 8/2001 | Liang et al. ................ 327/536 |
| 6,509,796 B2 | 1/2003 | Nguyen et al. |
| 2003/0128071 A1 | 7/2003 | Nguyen et al. |

FOREIGN PATENT DOCUMENTS

| | | |
|---|---|---|
| EP | 0 583 586 A1 | 2/1994 |
| EP | 0 587 965 A1 | 3/1994 |

OTHER PUBLICATIONS

Furth, P.M. and Andreou, A.G., "Linearised differential transconductors in subthreshold CMOS," Electronics Letters, vol. 31, No. 7, pp. 545–547 (Mar. 30, 1995).

Mensink, C.H.J. et al., "A CMOS "Soft–Switched" Transconductor and Its Application in Gain Control and Filters," IEEE Journal of Solid–State Circuits, vol. 32, No. 7, IEEE, pp. 989–998 (Jul. 1997).

* cited by examiner

*Primary Examiner*—Kenneth B. Wells
(74) *Attorney, Agent, or Firm*—Sterne, Kessler, Goldstein & Fox P.L.L.C.

(57) ABSTRACT

A charge pump circuit includes a high-swing transconductance amplifier. A high input swing transconductance is provided in a negative feedback loop of the charge pump circuit without an abrupt change in transconductance. The high-swing transconductance amplifier includes a transconductance cell and high-swing circuitry. The transconductance cell includes a current supply transistor, which provides current for transconductance while input voltages are within the operational range for the transconductance cell. When the input voltages increase so as to be outside of the operational range, the current source transistor enters into triode region of operation, and provides reduced current. The high-swing circuitry supplies the current in this case so that abrupt change in transconductance does not occur. The high-swing circuitry widens the output compliant voltage range of the charge pump circuit and hence reduces the sensitivity requirement of the VCO, Kvco, in any PLL design, in particular design for PLLs used in tuners.

4 Claims, 8 Drawing Sheets

CHARGE PUMP INCLUDING A FEEDBACK DEVICE FOR USE IN A PHASE-LOCKED LOOP

CROSS-REFERENCE TO RELATED APPLICATIONS

The present application is a continuation of U.S. Ser. No. 09/956,114, filed Sep. 20, 2001, (now U.S. Pat. No. 20022006538), which claimed priority to U.S. Provisional Patent Application No. 60/235,725, entitled "High Swing Transconductance Amplifier for Charge Pump Circuit," filed Sep. 27, 2000, which are both incorporated by reference herein in their entireties.

The present application contains subject matter related to the subject matter in commonly owned U.S. Pat. No. 6,509,796 ("the '796 Patent") that issued Jan. 21, 2003, the contents of which are incorporated by reference herein in its entirety.

BACKGROUND OF THE INVENTION

1. Field of the Invention

The present invention is related to charge pump circuits, and particularly to a high-swing transconductance amplifier for providing transconductance over an increased range of input voltages.

2. Related Art

Phase-locked loop (PLL) circuits are used in various different applications including, but not limited to, frequency tuners (e.g., satellite tuners) for selecting different television and/or radio channels. In a PLL circuit, a feedback loop is generally used to adjust frequency/phase of a voltage-controlled oscillator (VCO) output signal until the VCO output signal aligns with a reference clock signal.

The PLL circuit typically includes a charge pump circuit to provide voltage control signal Vc with sufficient charge for proper VCO operation. The charge pump circuit typically includes a transconductance cell, which may also be referred to as a transconductance amplifier, to generate current using input voltage signals, which are adjusted based on phase/frequency relationship between the reference clock and the VCO output signal.

The, voltage control signal Vc output by the charge pump circuit is often limited by the transconductance capability of the transconductance cell. For example, the transconductance cell typically includes a current supply transistor that enters into triode region of operation as the voltage control signal Vc increases, resulting in abrupt change to the transconductance capabilities since the current supply transistor typically provides less current when operating in triode region. The sensitivity requirement of the VCO, Kvco, in any PLL design may be reduced when the VCO control voltage range of the charge Pump circuit can be widened.

Therefore, it is desirable to provide a transconductance cell that is capable of transconductance over a wider range of input voltages.

SUMMARY OF THE INVENTION

In one embodiment according to the present invention, a transconductance amplifier is provided. The transconductance amplifier includes a transconductance cell for receiving one or more input voltage signals and for generating one or more first currents using the input voltage signals. The transconductance cell is used to supply a current output including at least a portion of the first currents. The transconductance amplifier also includes high-swing circuitry for receiving the input voltage signals, for generating one or more second current signals using the input voltage signals and for providing at least, a portion of the second current signals to the transconductance cell to be included in the current output. The first currents provide more than half of the current output while the input voltage signals are within first range of voltages. The second currents provide more than half of the current output while the input voltage signals are not within the first range of voltages.

In another embodiment according to the present invention, a method of generating a current output using a transconductance amplifier is provided. The transconductance amplifier includes a transconductance cell and high-swing circuitry. One or more input voltage signals are received. One or more first currents are generated in the transconductance cell for inclusion in the current output. One or more second currents are generated in the high-swing circuitry for inclusion in the current output. At least a portion of the second currents is provided to the transconductance cell for inclusion on the current output. The first currents provide more than half of the current output while the input voltage signals are within first range of voltages. The second currents provide more than half of the current output while the input voltage signals are not within the first range of voltages.

In yet another embodiment according to the present invention, a charge pump is provided. The charge pump includes an i/o circuit for receiving one or more voltage difference signals and for generating a voltage control signal and one or more input voltage signals. The charge pump also includes a transconductance amplifier having a transconductance cell and high-swing circuitry. The transconductance amplifier is used to provide a current output to the i/o circuit, and the current output is used to provide charge for the voltage control signal. The voltage control signal and the input voltage signals are generated based on the voltage difference signals. The transconductance cell generates more than half of the current output when the input voltage signals are within a first range of voltages. The high-swing circuitry generates more than half of the current output when the input voltage signals are not within the first range of voltages.

In still another embodiment of the present invention, a phase-locked loop (PLL) is provided. The PLL includes a phase detector for receiving a reference clock signals and a voltage controlled oscillator (VCO) output signal, and for generating one or more voltage difference signals. The PLL also includes a charge pump for receiving the voltage difference signals and for generating a voltage control signal with sufficient charge for VCO operation. In addition, the PLL includes a VCO for receiving the voltage control signal and for generating the VCO output signal based or, the voltage control signal. The charge pump includes a transconductance cell and a high-swing circuitry. The transconductance cell generates more than half of the charge when the VCO output signal is within a first range of voltages. The high-swing circuitry generates more than half of the charge when the VCO output signal is not within the first range of voltages.

BRIEF DESCRIPTION OF THE DRAWINGS

These and other aspects of the invention may be understood by reference to the following detailed description, taken in conjunction with the accompanying drawings, which are briefly described below.

DETAILED DESCRIPTION OF THE INVENTION

Figure 1:
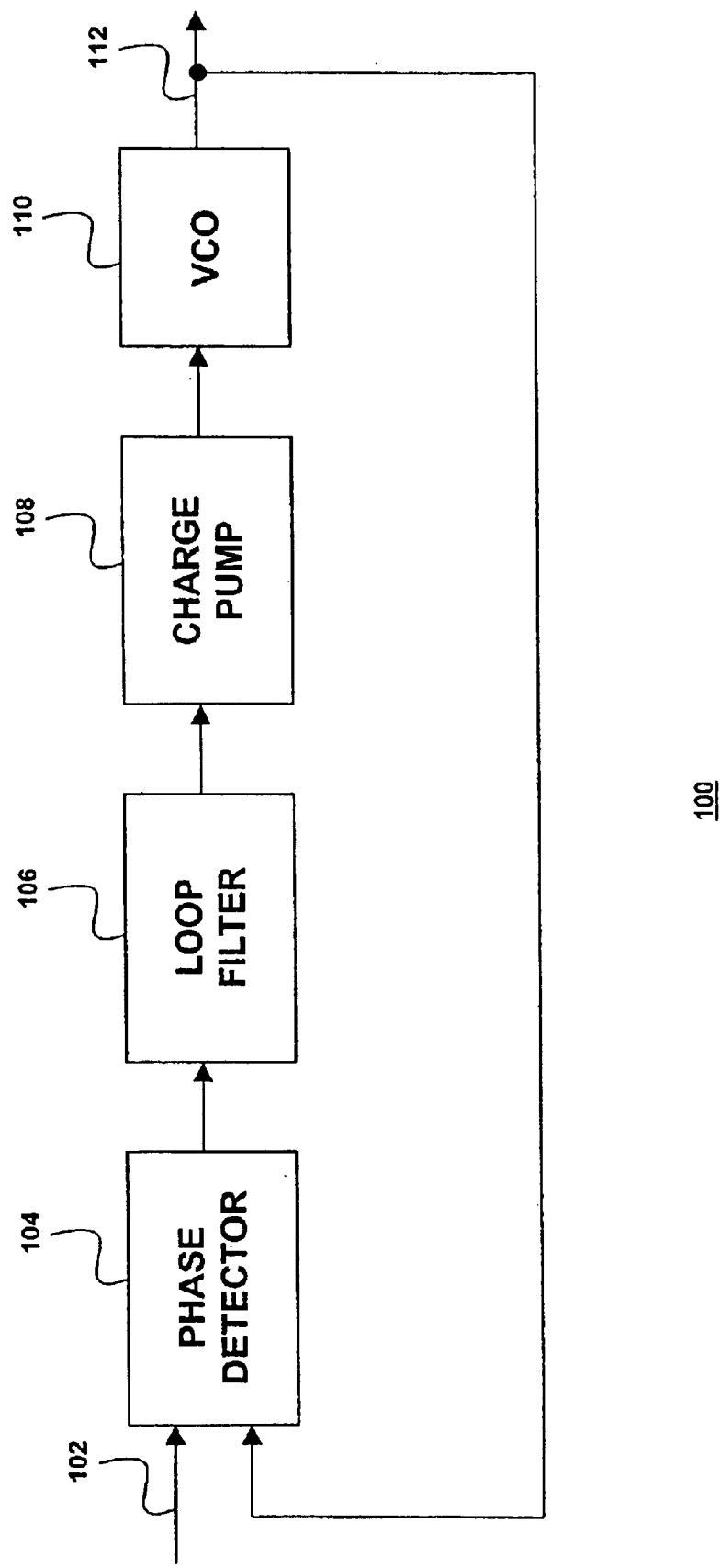
FIG. 1 is a block diagram of a phase-locked loop (PLL) circuit, which may include an embodiment according to the present invention.

FIG. 1 is a block diagram of a phase-locked loop (PLL) circuit 100, which may include an embodiment according to the present invention. The PLL circuit 100 includes a phase detector 104, a loop filter 106, a charge pump 108, and a voltage controlled oscillator (VCO) 110. The phase detector 104 preferably receives a reference clock 102 and an output 112 of the VCO 110. The VCO output 112 is an output of the PLL circuit 100, and is fed back into the PLL circuit.

The phase detector 104 compares phase and/or frequency between the reference clock 102 and the VCO output 112. The phase detector 104 preferably generates one or more signals to indicate phase and/or frequency difference between the VCO output 112 and the reference clock 102, and provides the difference signals to the charge pump 108 via the loop filter 106. The loop filter 106 may be a low pass filter used to filter out high frequency components of the difference signals from the phase detector 104.

The charge pump 108 preferably accumulates electrical change based on the difference signals and provides a voltage, control signal with sufficient current to the VCO 110 to adjust phase and/or frequency of the VCO output 112. The charge pump 108 preferably includes a transconductance cell for generating current using input voltages based on the difference signals from the phase detector 104. The charge pump 108 in one embodiment of the present invention may include high-swing circuitry for increasing the range of input voltages over which the transconductance of the transconductance cell does not change abruptly.

The PLL circuit of FIG. 1 is shown for illustrative purposes only. The present invention may be applied to any PLL circuit as well as any other circuit including a charge pump. For example, the charge pump of the present invention may be applied to the PLL circuit of FIG. 17, the frequency synthesizer of FIG. 18, and a PLL 4506 of FIG. 46a, all of which are disclosed in the above mentioned '796 patent, the contents of which have been incorporated by reference in full.

Figure 2:
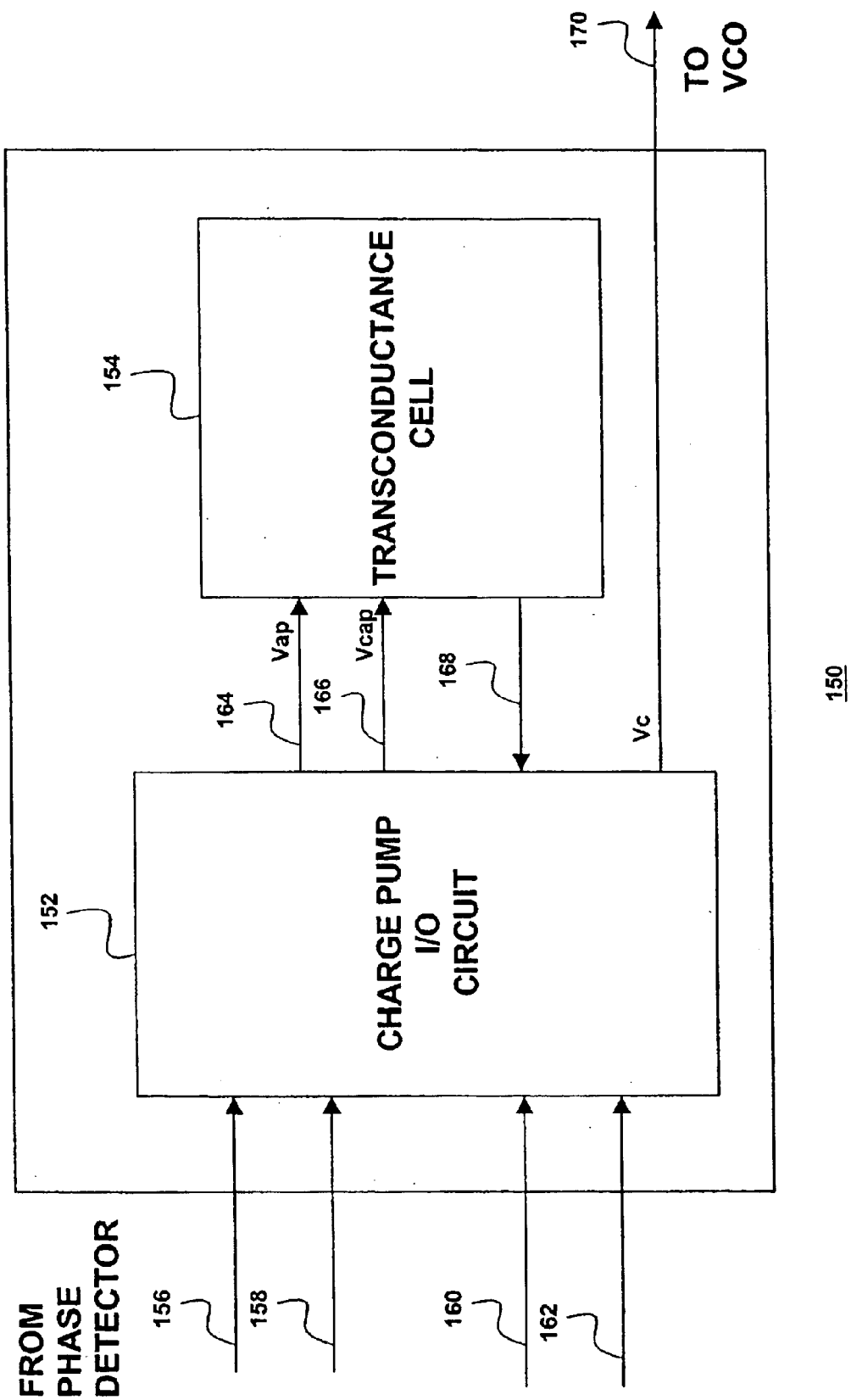
FIG. 2 is a block diagram of a charge pump including a charge pump I/O circuit and a transconductance cell.

FIG. 2 is a block diagram of a charge pump 150. The charge pump 150 includes a charge pump input/output (I/O) circuit 152 and a transconductance cell 154. The transconductance cell 154 may also be referred to as a transconductance amplifier. The charge pump 150, for example, may be used in the charge pump 108 of FIG. 1.

The charge pump I/O circuit 152 preferably receives difference signals 156, 158, 160 and 162 from a phase detector such as, for example, the phase detector 104 of FIG. 1. The difference signals include two pairs of differential signals 156, 158 and 160, 162. The first pair of differential signals 156, 158 includes an UP signal and an UP signal. The UP and UP differential signals preferably are generated by the phase detector when the output of the VCO has lower frequency and/or phase lag compared to a reference clock. The UP and UP differential signals preferably increase frequency of the VCO output and/or phase shift (towards phase lead) the VCO output by increasing a VCO control signal Vc 170 provided to a VCO, such as the VCO 110 of FIG. 1. The VCO control signal Vc 170 may also be referred to as a control voltage.

The second pair of differential signals 160, 162 includes a DOWN signal and a DOWN signal. The DOWN and DOWN' differential signals 160, 162 are generated by the phase detector when the output of the VCO has higher frequency and/or phase lead compared to the reference clock. The DOWN differential signals preferably decrease frequency of the VCO output and/or phase shift (towards phase lag) the VCO output by decreasing the VCO control signal Vc 170 provided to the VCO.

The charge pump I/O circuit 152 preferably provides voltage difference signals Vap 164 and Vcap 166 to the transconductance cell 154. The transconductance cell 154 preferably generates current based on the voltage level of the Vap and Vcap signals 164, 166, and provides a negative feedback current 168 to the charge pump I/O circuit 152 to provide sufficient charge to the VCO for its operation. When the PLL is in lock, the VCO control signal Vc 170 and the Vap and Vcap signals 164, 166 may all be at the identical level because of the negative feedback loop used.

Figure 3:
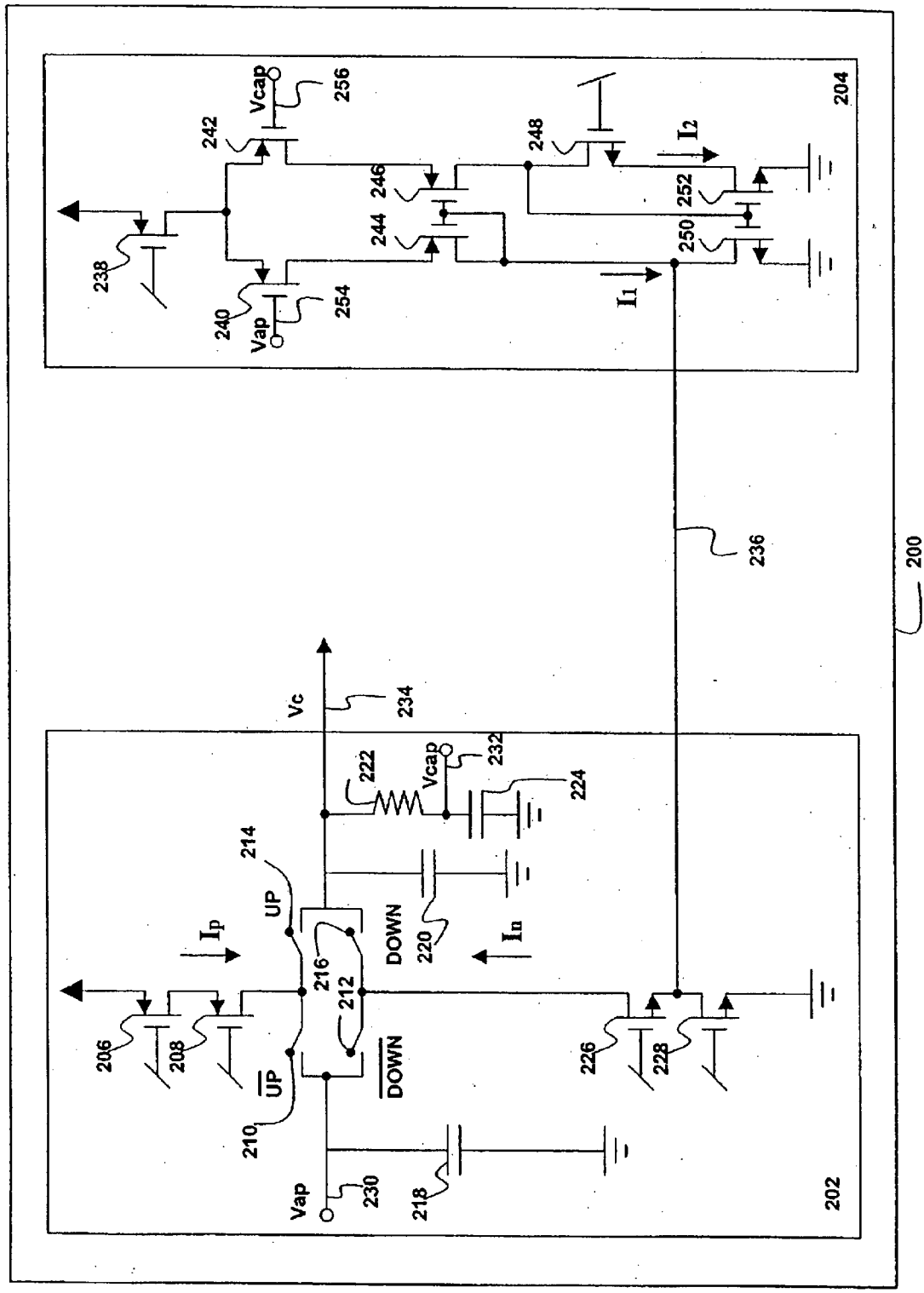
FIG. 3 is a circuit diagram of the charge pump of FIG. 2.

FIG. 3 is a circuit diagram of a charge pump 200. The charge pump 200, for example, may be similar to the charge pump 150 of FIG. 2. The charge pump 200 includes a charge pump I/O circuit 202 and a transconductance cell 204.

The charge pump I/O circuit 202 includes two positive channel (p-channel) metal-oxide semiconductor (PMOS) transistors 206 and 208. A source of the PMOS transistor 206 is coupled to a voltage supply. Depending on the fabrication technology used, the voltage supply may be 3.3 V, 1.8 V, 1.3 V or any other suitable voltage. Gates of the PMOS transistors 206 and 208 are coupled to a suitable bias voltage supplied by respective biasing circuits (not shown). Design and use of biasing circuits for biasing PMOS transistors 206, 208 as well as for biasing various different PMOS and NMOS transistors used for implementation of the present invention are well known to those skilled in the art.

A drain of the PMOS transistor 206 is coupled to a source of the PMOS transistor 208, and a drain of the PMOS transistor 208 is coupled to UP and UP switches 214 and 210. Thus, the PMOS transistors 206 and 208 are coupled in series between the voltage supply and the UP and UP switches, The PMOS transistors 206 and 208 function as a current-source for providing p-channel current $I_p$.

The UP and UP switches 214, 210 and DOWN and DOWN switches 216, 212 are depicted as switches in FIG. 3, but in practice, they may be implemented using transistors. The UP and UP differential signals and DOWN and DOWN differential signals preferably are digital signals that take on the value of high or low (e.g., "1" or "0"). For example, when the VCO output lags in phase of and/or is lower in frequency than the reference clock signal, the UP signal of high (or on) is applied to the UP switch 214 while the DOWN signal of low (or off) is applied at the switch 216. In other embodiments where inverse logic has been used, the UP signal of low and the DOWN signal of high may be applied at the UP switch 214 and the DOWN switch 216, respectively.

The UP and DOWN signals are opposite of the UP and DOWN signals, respectively. In this case, when the UP and DOWN signals are high and the UP and DOWN signals are low, the switch 214 and the switch 212 are closed while the switches 210 and 216 remain open. When the VCO output leads in phase of and/or is higher in frequency than the reference clock, on the other hand, the UP switch 210 and the DOWN switch 216 preferably are closed and the UP switch 212 and the DOWN switch 214 preferably remain open.

When the UP switch 214 is closed, the p-channel current $I_p$ preferably flows into a capacitor 220, and into a capacitor 224 via a resistor 222. As the capacitors 220 and 224 are charged up, a VCO control signal Vc 234 and the Vcap voltage 232 increase. Meanwhile, the DOWN switch 212 is closed, and a capacitor 218 is discharged through negative-channel (n-channel) metal-oxide semiconductor (NMOS) transistors 226 and 228, thus decreasing Vap voltage 230. A drain of the NMOS transistor 226 is coupled to the DOWN and DOWN switches 216 and 212. A drain of the NMOS transistor 228 is coupled to a source of the NMOS transistor 226 and receives a negative feedback current 236. A source of the NMOS transistor 228 is coupled to ground. Gates of the NMOS transistors 226 and 228 are coupled to suitable bias voltages from respective biasing circuits (not shown), the design and use of which are well known to those skilled in the art.

When the DOWN switch 216 is closed, the capacitors 220 and 224, are discharged via the NMOS transistors 226 and 228 A these capacitors are discharged, the VCO control signal Vc 234 and the Vcap voltage 232 tend to decrease. When the VCO Control signal Vc 234 decreases, the VCO tends to decrease in frequency and/or shifts phase (towards phase lag, to be in line with the reference clock signal. Meanwhile, the UP switch 210 preferably closes, and the p-channel current $I_p$ preferably flows into the capacitor 218, tending to increase the Vap voltage 230.

When the PLL is in lock, the VCO control voltage Vc 234 preferably should be kept constant. To keep the VCO control voltage Vc 234 constant, the charge pump 200 should be kept quiet, i.e., the UP and DOWN signals should be kept low. Frequency/phase detectors, such as, for example, the phase detector 104 of FIG. 1, are typically designed so that, when the PLL achieves lock, both the UP and DOWN signals become high for a very small fraction of a clock period. Then, both the UP and DOWN signals become low, making the UP and DOWN signals high. When both the UP and DOWN signals are high, the UP and DOWN switches 210 and 212 are closed, the p-channel current $I_p$ flows through them, and a feedback loop is established through the Vap and Vcap voltages.

The Vap voltage 230 and the Vcap voltage 232 are provided to the transconductance cell 204 as Vap voltage 254 Vcap voltage 256, respectively. The transconductance cell 204 includes a PMOS transistor 238 as a tail current source. The term "tail current source" often designates a current source that is connected from supply (power or ground) to the source of a differential pair of transistors.

A source of the PMOS transistor 238 is coupled to the voltage supply, which, for example, may be 3.3V or any other suitable voltage. A gate of the PMOS transistor 238 is coupled to a suitable bias voltage from a biasing circuit (not shown), the design and use of which is well known those skilled in the art. A drain of the PMOS transistor 238 is coupled to sources of PMOS transistors 240 and 242. Gates of the PMOS transistors 240 and 242 are coupled to the Vap voltage 254 and the Vcap 256 voltage, respectively. The Vap voltage 254 and the Vcap voltage 256 preferably are identical to the Vap voltage 230 and the Vc v(111tage 256.

The Vap voltage 254 and the Vcap voltage 256 preferably are used to control the magnitude of the current supplied by the PMOS transistor 238 (tail current source). The current $I_1$ through the PMOS transistor 240 flow through a PMOS transistor 244 and then is divided between the negative feedback current 236 and the current through an NMOS transistor 250. The current $I_2$ through the PMOS transistor 242 flows through a PMOS transistor 246, an NMOS transistor 248, and then through an NMOS transistor 252.

Gates of the NMOS transistors 250 and 252 are coupled to one another and to a drain of the NMOS transistor 248. A source of the NMOS transistor 248 is coupled to a drain of the NMOS transistor 252. Sources of the NMOS transistors 250 and 252 are coupled to ground.

A portion of the current $I_1$ is provided to the charge pump I/O circuit as the negative feedback current 236. The negative feedback current 236 preferably adjusts the n-channel Current $I_n$ to match the p-channel current $I_p$. The transconductance cell 204 preferably performs such adjustment of the negative feedback current 236 through detecting the difference in voltages between the Vap voltage 230 and the Vcap voltage 232.

As the Vap and Vcap voltages 254 and 256 increase, the PMOS transistors 240 and 242 tend to shut off, and the currents $I_1$ and $I_2$ tend to decrease. The voltage at the source of the PMOS transistors 240 and 242 tend to increase, and Vds voltage between the source and the drain of the PMOS transistor 238 tends to decrease. In this case, the PMOS transistor 238 may enter into triode region of operation. This typically occurs when the Vds of the PMOS transistor 238 is less than the effective voltage at its gate. As the PMOS transistor 238 enters into the triode region of operation, the transconductance drops since the current through the PMOS transistor 238 decreases.

In the charge pump 200 of FIG. 3, therefore, the upper limit of the control voltage Vc is limited by the input swing of the differential pair of PMOS transistors 240 and 242 in the transconductance cell. In this case, the input swing of the PMOS transistors 240 and 242 is limited by the Vgs between the gate and the source of these PMOS transistors plus the drain saturation voltage (Vdsat) of the PMOS transistor 238 (tail current source). For example, when Vds is bigger than Vdsat, the transistor is generally said to be operating in saturation region, and when Vds is smaller than Vdsat, the transistor is generally said to be operating in triode region.

Figure 4:
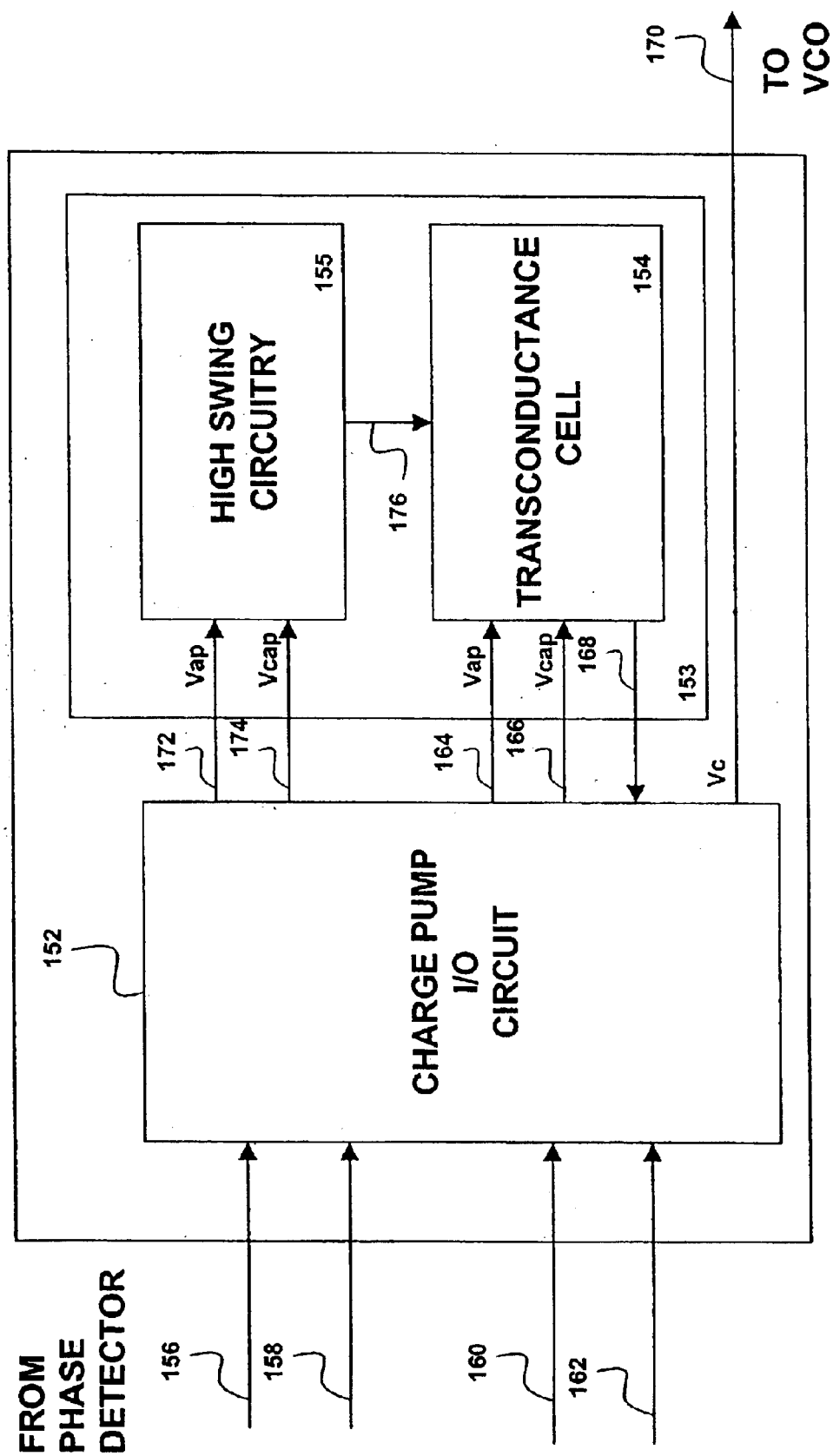
FIG. 4 is a block diagram of a charge pump according to an embodiment of the present invention.

FIG. 4 is a block diagram of a charge pump 151 in an embodiment according to the present invention. The charge pump 151 includes a charge pump I/O circuit 152 and a transconductance cell 154, which are similar to the corresponding components of the charge pump 150 of FIG. 2. In addition to the charge pump I/O circuit 152 and the transconductance cell 154, the charge pump 151 includes high-swing circuitry 155. The high-swing circuitry 155 and the transconductance 154 form a high-swing transconductance cell which may also be referred to as a high-swing transconductance amplifier.

The high-swing circuitry 155 receives Vap and Vcap voltages 172 and 174 from the charge pump I/O circuit 152.

The high-swing circuitry 155 preferably provides current 176 to the transconductance cell 154 when the tail current source (e.g., PMOS transistor) in the transconductance cell 154 enters into triode region of operation and the output current 168 tends to decrease. This way, the output current 168 provided to the charge pump I/O circuit 152 preferably is maintained even when the tail current source enters into the triode region of operation. Thus, the operational range of the VCO control signal Vc 170 of the charge, pump 151 is increased compared to the charge pump 150 (without a high-swing circuitry) of FIG. 2, provided that both the charge pump 151 and the charge pump 151 receive the same power supply voltage, e.g., Vdd, from the voltage supply.

Figure 5:
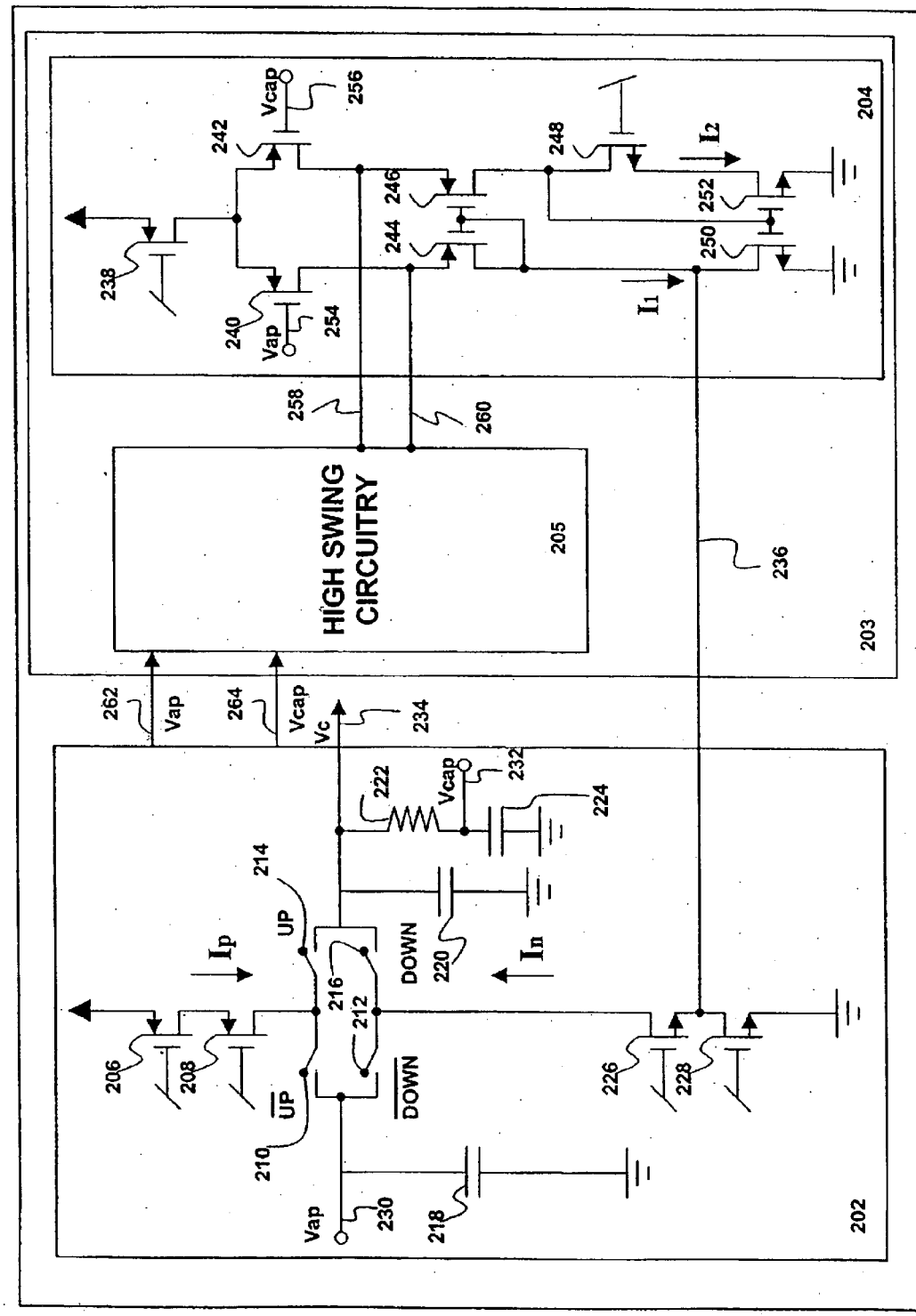
FIG. 5 is a partial circuit diagram of a charge pump of FIG. 4.

FIG. 5 is a partial circuit diagram of a charge pump 201 in an embodiment according to the present invention. The charge pump 201 is similar to the charge pump 200 of FIG. 3 except that the charge pump 201 includes high-swing circuitry 205. The high-swing circuitry 205 preferably receives Vap and Vcap voltages 262 and 264 from the charge pump I/O circuit 202. When the transistor 238 enters into triode region of operation, and thus—$I_1$ and $I_2$ currents tend to decrease, the high-swing circuitry 205 preferably supplies currents 258 and 260 so as to maintain the magnitude of the $I_1$ and $I_2$ currents. This way, the negative feedback current 236 supplied to the charge pump I/O circuit—202 does not undergo abrupt changes when the PMOS transistor 238 enters into the triode region of operation.

Figure 6:
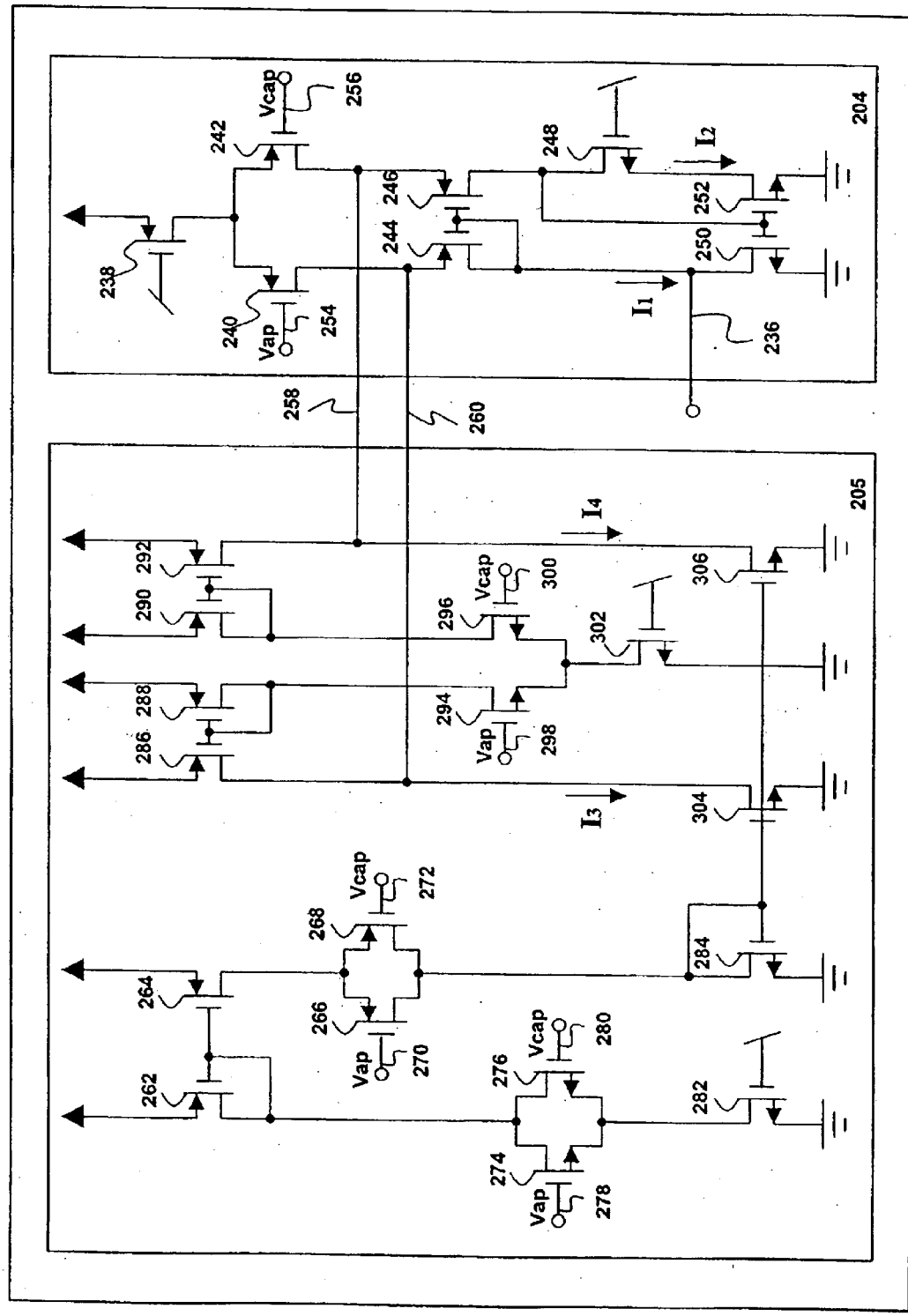
FIG. 6 is a circuit diagram of a high-swing transconductance cell according to an embodiment of the present invention.

FIG. 6 is a circuit diagram of a high-swing transconductance cell 203 of FIG. 5. The high-swing transconductance cell 203, in addition to the transconductance cell 204, includes high-swing circuitry 205. The high-swing circuitry 205 preferably maintains $I_1$ and $I_2$ currents when the PMOS transistor 238 (tail current source) enters into the triode region of operation so that the negative feedback current 236 provided by the high-swing transconductance cell 203 to the charge pump I/O circuit 202 does not abruptly decrease.

The high-swing circuitry 205 includes PMOS transistors 286, 288, 290 and 292. A gate and a drain of the PMOS transistor 288 are coupled to one another, and a source of the PMOS transistor 288 is coupled to voltage supply, which may be 3.3V. The voltage supply in other embodiments may be V 1. 3V or any other suitable voltage for supplying power the high-swing transconductance cell 203. Those skilled in the art would appreciate that the selection of the –voltage level for the voltage supply typically depends on the type of fabrication technology used to fabricate the circuitry.

Since the gate and the drain of the PMOS transistor 288 are coupled to one another and the source is coupled to the voltage supply, the PMOS transistor 288 operates similar to a diode current source. A source of the PMOS transistor 286 is coupled to the voltage supply and a gate of the PMOS transistor 286 is coupled to the gate of the PMO: transistor 288. Therefore, the PMOS transistor 286 is configured as a current mirror of the PMOS transistor 288. In other words, the currents flowing through the PMOS transistors 286 and 288 would be similar in magnitude to each other as long as the PMOS transistors 286 and 288 have similar dimensions. In an embodiment according to the present invention, the PMOS transistors 286 and 288 preferably have similar dimensions.

A source of the PMOS transistor 290 is coupled to the voltage supply, and a gate and a drain of the PMOS transistor 290 are coupled to one another. Therefore, similarly to the PMOS transistor 288, the PMOS transistor 290 is configured as a current source diode. The PMOS transistor 292 has its source coupled to the voltage supply arid its gate coupled to the gate of the PMOS transistor 290. Therefore, the PMOS transistor 292 is configured as a current mirror of the PMOS transistor 290.

Drains of the PMOS transistors 286 and 292 are coupled to the drains of the PMOS transistors 240 and 242, respectively, over current supply lines 260 and 258. When the Vap and Vcap voltages 254 and 256 increase so as to force the PMOS transistors 238 into triode region of operation, the PMOS transistors 286 and 292 preferably provide currents over the current supply lines 260 and 258 to make up for the reduction in currents through the PMOS transistors 240 and 242, respectively.

The drains of the PMOS transistors 288 and 290 are coupled to drains of NMOS transistors 294 and 296, respectively, such that the currents flowing through the PMO transistors 288 and 290 may be controlled by controlling currents that flow through the NMOS transistors 294 and 296, respectively.

Gates of the NMOS transistors 294 and 296 are coupled to Vap and Vcap voltages 298 and 300, respectively. The Vap and Vcap voltages 298 and 300, preferably are identical to the Vap and Vcap voltages 254 and 256 provided to the gates (D" the PMOS transistors 240 and 242. Thus, as the PMOS transistors 240 and 242 tend to shut off due to increasing Vap and Vcap voltages, the NMOS transistors 294 and 296 tend to open up to conduct increased currents. Therefore, when the Vap and Vcap voltages 254, 256 go up to the point where the PMOS transistor 238 (tail current source) enters into the triode region of operation, the differential pair of NMOS transistors 294 and 296 preferably provide sufficient transconductance to prevent abrupt changes to the magnitude of the $I_1$ and $I_2$ currents.

Sources of the NMOS transistors 294 and 296 are coupled to a drain of an NMOS transistor 302. A gate of the NMOS transistor 302 is coupled to a bias voltage supplied by a biasing circuit (not shown). The design and use of the biasing circuit to apply suitable potential at the (late of the NMOS transistor 302 is well known to those skilled in the art. A source of the NMOS transistor 302 is coupled to ground.

The PMOS transistors 286, 288, 290, 292 and the NMOS transistors 294, 296, 304 and 306 may be referred to as a differential current mirror circuit, which supplies currents to the transconductance cell 204 as needed. When the Vap, and Vcap voltages 254, 256 increase, the current through the PMOS transistors 238 decreases. In order to maintain the $I_1$ and $I_2$ currents, the currents through the PMOS transistors 286 and 292, respectively, preferably are supplied to the transconductance cell 204 over the current supply lines 260, 258 respectively. In order to channel the currents through the PMOS transistors 286 and 292 to the transconductance cell 204 and not as currents I3 and I4 towards ground, NMOS transistors 304 and 306 preferably are used to control the currents I3 and I4.

When the transconductance cell is used by itself without a high-swing circuitry, the input swing of the Vap and Vcap voltages have been limited to Vgs of the PMOS transistors 240 and 242 plus the Vdsat of the PMOS transistor 238 (tail current source). With the addition of the high-swing circuitry, the input swing is increased by Vgs of the NMOS transistors 294 and 296 since they supply currents to be the $I_1$ and $I_2$ currents when the PMOS transistor 238 enters into the triode region. Since the Vcap voltage is filtered VCO control voltage, the swing of the VCO control voltage is similarly increased.

The drains of the PMOS transistors 286 and 292 are coupled to drains of the NMOS transistors 304 and 306, respectively. Sources of the NMOS transistors 304 and 306 are coupled to ground, respectively. Gates of the NMOS transistors 304, 306 are coupled to a gate of an NMOS transistor 284. A source of the NMOS transistor 284 is coupled to ground, and the gate and a drain of the NMOS transistors 284 are coupled to one another. Thus, the NMOS transistor is configured as a diode, and the NMOS transistors 304 and 306 are current mirrors of the NMOS transistor 284.

As the Vap and Vcap voltages 254 and 256 increase, the $I_1$ and $I_2$ currents tend to gradually lose transconductance. In order to make up for the gradual loss to transconductance, the currents supplied over the current supply lines 258 and 260 preferably should increase gradually as well. To this end, the currents I3 and I4 preferably should be decreased gradually to provide gradually increasing currents over the current supply lines 258 and 260. In the embodiment of the present invention depicted in FIG. 6, a transistor configuration similar to that of the PMOS transistors 240 and 242 is used to result in the gradual decrease of the I3 and I4 currents.

The drain of the NMOS transistor 284 is also coupled to drains of PMOS transistors 266 and 268, which together may be referred to as PMOS input transistors. The first PMOS input transistors are configured similarly to the PMOS transistors 240 and 242 in the transconductance cell 204.

The PMOS transistors 266 and 268 receive Vap and Vcap voltages 2VO and 272 at their respective gates. The Vap and Vcap voltages 270 and 272 preferably are provided by the charge pump I/O circuit 202, and preferably are identical to the Vap and Vcap voltages 254 and 256. Sources of the PMOS transistors 266 and 268 are coupled to a drain of a PMOS transistor 264 whose source is coupled to the voltage supply. Therefore, as the PMOS transistors 240 and 242 tend to push the PMOS transistor 238 into triode region of operation as the Vap and Vcap voltages 254, 256 increase, tending to decrease the $I_1$ and $I_2$ currents, the PMOS transistors 266 and 268 tend to push the PMOS transistor 264 into triode region of operation as the Vap and Vcap voltages 270 and 272 increase, tending to decrease the $I_3$ and $I_4$ currents.

A gate of the PMOS transistor 264 is coupled to a gate of PMOS transistor 262 whose source is coupled to the voltage supply. The gate and a drain of the PMOS 262 are coupled to one another. Therefore, the PMOS transistor 262 is configured as a current source diode and the PMOS transistor 264 is configured as a current mirror of the PMOS transistor 262.

When the Vap and Vcap voltages 298 and 300 go down to the point where the NMOS transistor 302 is in triode region of operation, the PMOS transistors 240 and 242 preferably provide sufficient transconductance to supply the $I_1$ and $I_2$ currents. However, if the $I_3$ and $I_4$ current paths are left unchecked, a portion of currents through the PMOS transistors 240 and 242 may instead be provided as the $I_3$ and $I_4$ currents. Therefore, the PMOS transistor 262 should be pushed into triode region of operation as well when the Vap and Vcap voltages are sufficiently low, so that the current flowing through the PMOS transistor 264 and the NMOS transistor 284 are limited, which in turn, limits the $I_3$ and $I_4$ currents flowing through the NMOS transistors 304 and 306, respectively.

To this end, the drain of the PMOS transistor 262 is coupled to drains of NMOS transistors 274 and 276, which may be referred to as first NMOS input transistors. Gates of the NMOS transistors 274 and 276 are coupled to Vap and Vcap, voltages 278 and 280. The Vap and Vcap voltages 278 and 280 preferably are provided by the charge pump I/O circuit 202, and preferably are identical the Vap and Vcap voltages 254 and 256.

Sources of the NMOS transistors 274 and 276 are coupled to a drain of an NMOS transistor 282 whose source is coupled to ground. A gate of the NMOS transistor 282 is coupled to a bias voltage provided by a biasing circuit (not shown). Design and use of biasing circuits are well known for those skilled in the art.

Figure 7:
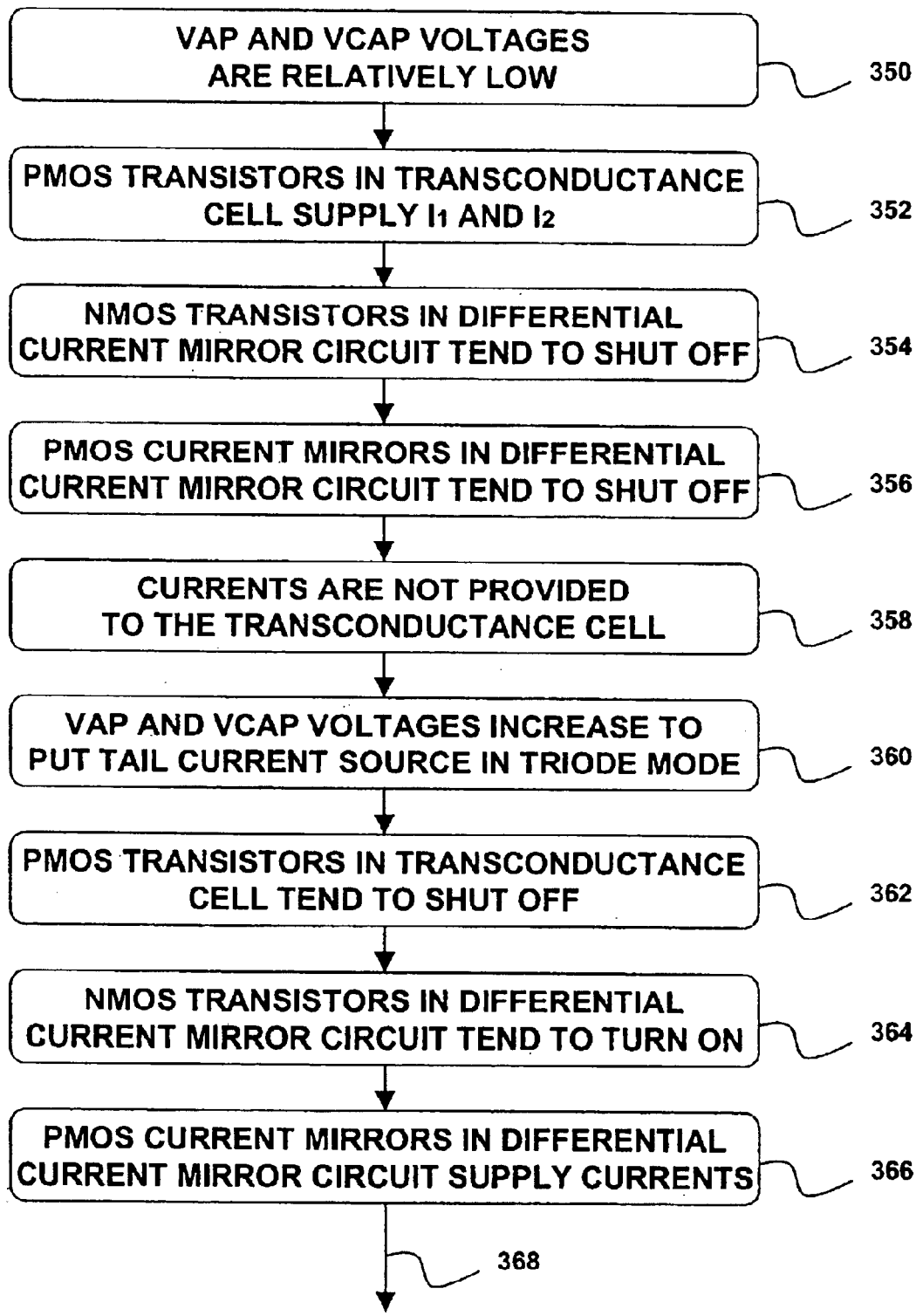
FIGS. 7 and 8 illustrate a flow diagram of the process of providing currents from the high-swing circuitry to the transconductance cell of FIG. 6, such that the current provided to the charge pump I/O circuit is not abruptly decreased when the tail current source enters into the tricode region of operation.
Figure 8:
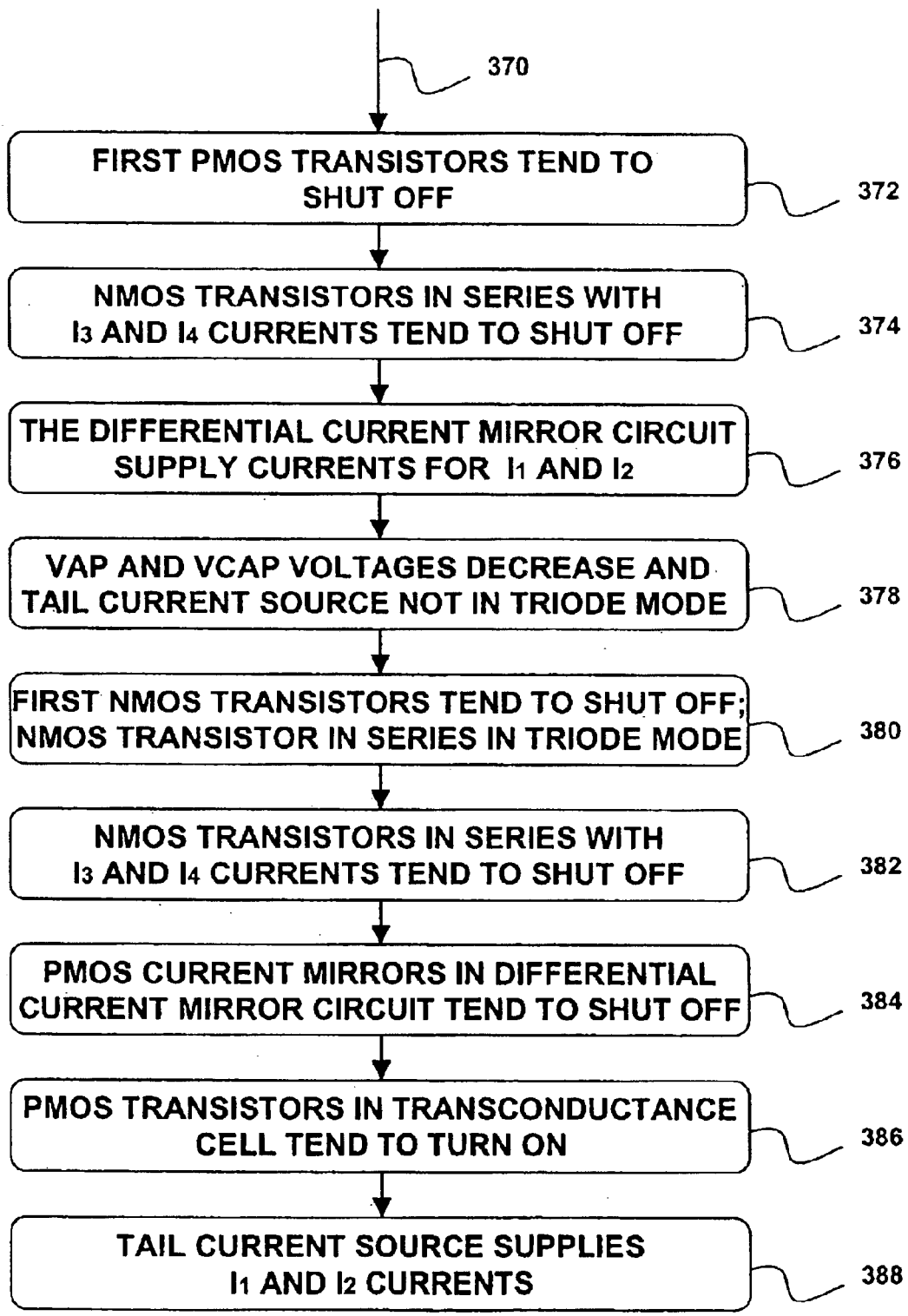

The operation of the high-swing transconductance cell 203 may he described in reference to FIGS. 7 and 8. FIG. 7 and illustrate, a flow diagram of the process of providing currents from the high-swing circuitry 205 to the transconductance cell 204, such that the current provided to the charge pump I/O circuit 202 is not abruptly decreased when the PMOS transistor 238 (tail current source enters into the triode region of operation. The FIGS. 7 and 8 also illustrate the process of recovering from the PMOS transistor 238 (tail current source) being in the triode region.

In step 350 of FIG. 7, the Vap and Vcap voltages 254 and 2-96 are relatively low, i.e., not high enough to push the PHOS transistor 238 (tail current source) into triode region of operation. When the Vap and Vcap voltages are not high enough to push the PMOS transistor 238 into the triode region of operation, the $I_1$ and $I_2$ currents are provided through the PMOS transistors 240 and 242 in the transconductance cell 204 as indicated in step 352.

When the Vap and Vcap voltages 254 and 256 are substantially low, the Vap and Vcap voltages 298 and 300 are substantially low as well. In this case, as indicated in step 354, the NMOS transistors 294 and 296 in the differential current mirror circuit tend to shut off. As a result, the currents through the PMOS transistors 288 and 290 tend to be small. Since the PMOS transistors 286 and 292, which supply the $I_3$ and $I_4$ currents, are current mirrors of the PMOS transistors 288 and 290, respectively, they tend to shut off as well, as indicated in step 356, and substantially no current is provided to the transconductance cell 204 over the current supply lines 260 and 358 to add to the $I_1$ and $I_2$ currents, respectively, as indicated in step 358.

As the output voltage Vc (provided to the VCO to adjust frequency and/or shift phase) increases, the Vap and Vcap voltages increase as well. As the Vap and Vcap voltages increase, the Vgd of the PMOS transistor 238 (tail current source) increases until the PMOS transistor 238 enters into the triode region of operation as indicated step 360. The transconductance of the transconductance cell 234 for generating the $I_1$ and $I_2$ currents tend to gradually decrease as the PMOS transistors 240 and 242 tend to shut off as indicated in step 362.

While the transconductance of the transconductance cell 204 decreases, the NMOS transistors 294 and 296 in the differential current mirror circuit receive increased Vap and Vcap voltages 298 and 300, and they tend to turn on as indicated in step 364. As the NMOS transistors 294 and 296 turn on, gradually increasing currents that flow through the PMOS transistors 288, 290. As indicated in step 366, the currents flowing through the PMOS transistors 286, 292 increase as well since they are current mirrors of the PMOS transistors 288 and 290, respectively. The process continues to FIG. 8 as indicated by arrows 368 and 370.

While the PMOS transistors 286 and 292 conduct currents, the PMOS input transistors 266 and 268 tend to shut off in step 372 since the Vap and Vcap voltages 270 and 271 have been increased. Thus, substantially no current flows through the NMOS transistor 284 at sufficiently high Vap and Vcap voltages 270 and 272. The NMOS transistors 304 and 306 are current mirrors of the NMOS transistor 284, and therefore, the NMOS transistors 304 and 306 also tend to not conduct the $I_3$ and $I_4$ currents as indicated in step 374.

In the absence of substantial currents through the NMO-c transistors 304 and 306, the currents through the PMOS transistors 286 and 292 cannot flow through the NMOS transistors 304 and 306 as the currents $I_3$ and $I_4$, respectively. Therefore, the currents flowing through the PMOS transistors 286 and 292 are provided to the transconductance cell 204 over the current supply lines 260 and 258, respectively. The currents from the differential current mirror circuit, therefore, supplies currents as indicated in step 376 so that the currents $I_1$ and $I_2$ are not substantially reduced when the PMOS transistor 238 is operating in triode region.

When it is desired to decrease the VCO frequency and/or to phase shift (towards phase lag) the VCO output, the VCO control signal Vc of the charge pump 201 should be decreased in step 378, as the Vc voltage decreases, the Vap and Vcap voltages 254 and 260 decrease as well, and the PMOS transistor 238 may no longer operate in triode region.

As the Vap and Vcap voltages 278 and 280 decrease, the NMOS input transistors 274 and 276 tend to shut off as indicated in step 380, the NMOS transistor 282 in series enters into triode region of operation, and current flowing through the PMOS transistor 262 tends to substantially decrease. Since the PMOS transistor 264 is a current mirror of the PMOS transistor 262, the PMOS transistor 264 does not let much current flow through it either. Since substantially no current flows through the PMOS transistor 264. Substantially no current flows through the NMOS transistor 284.

Since the NMOS transistors 304 and 306 in series with the currents $I_3$ and $I_4$, respectively, are current mirrors of the NMOS transistor 284, they tend to shut off as well as indicated in step 382, and the magnitude of the currents $I_3$ and $I_4$ is not substantial. Meanwhile, the NMOS transistors 294 and 296 tend to shut off due to decreased Vap and Vcap voltages 298 and 300, and the NMOS transistor 302 enters into triode region of operation. In this case, since substantially no current flows through the PMOS transistors 288 and 290, the current mirror PMOS transistors 286 and 292 preferably conduct substantially no current as well, as indicated in step 384.

Since the Vap and Vcap voltages 254 and 256 have decreased, the PMOS transistors 240 and 242 in the transconductance cell tend to turn on as indicated in step 386. Since the PMOS transistor 238 is not in the triode region any more, and the PMOS transistors 240 and 242 conduct currents, the $I_1$ and $I_2$ currents are generated within the transconductance cell 204.

Although this invention has been described in certain specific embodiments, many additional modifications and variations would be apparent to those skilled in the art. It is therefore to be understood that this invention may be practiced otherwise than as specifically described. Thus, the present embodiments of the invention should be considered in all respects as illustrative and not restrictive, the scope of the invention to be determined by the appended claims and their equivalents.

For example, the present invention has been described in reference to PMOS and NMOS transistors. In various different embodiments of the present invention, any other suitable p-channel and n-channel transistors known to those skilled in the art, may be used. Further, as those skilled in the art would appreciate, various different semiconductor fabrication technologies, such as, for example, submicron fabrication technologies, may be used during fabrication of devices including the present invention, which may lead to selection of various different voltages as voltage supplies, bias voltages, VCO control voltages, and the like.

What is claimed is:

1. A charge pump, comprising:

an input/output (I/O) circuit that generates a differential output signal and a control signal; and a feedback circuit receiving the differential output signal from the I/O circuit and producing a feedback signal that is transmitted to the I/O circuit, wherein the feedback circuit includes a transconductance section and a compensation section, each separately receiving the differential output signal, the compensation section being used to reduce swing in the feedback signal, wherein the I/O circuit receives first and second differential input signals from a filter and produces the differential output signal therefrom, and wherein the control signal is generated from the first and second differential input signals and the feedback signal and is transmitted to a voltage controlled oscillator.

2. The charge pump of claim 1, wherein:

the transconductance section produces a first current signal;

the compensation section produces a second current signal;

the feedback signal is comprised of more of the first current signal than the second current signal during a first range of values of the differential output signal; and the feedback signal is comprised of a more of the second current signal than the first current signal during a second range of value of the differential output signal.

3. A phase-locked loop (PLL), comprising:

a phase detector;

a filter;

a charge pump; and a voltage controlled oscillator (VCO), wherein the phase detector receives an input signal and a signal from the VCO and produces a phase detector differential output signal therefrom, wherein the filter receives the phase detector differential output signal and produces a filtered differential output signal therefrom, wherein the charge pump comprises, an input/output I/O circuit that receives the filtered differential output signal and generates a I/O differential output signal and a control signal; and a feedback circuit that receives the I/O differential output signal and produces a feedback signal therefrom, which is transmitted to the I/O circuit, wherein the feedback circuit includes a transconductance section and a compensation section, each separately receiving the I/O differential output signal, the compensation section being used to reduce swing in the feedback signal, and wherein the control signal is generated from the filtered differential input signals and the feedback signal and is transmitted to the voltage controlled oscillator.

4. The PLL of claim 3, wherein:

the transconductance section produces a first current signal;

the compensation section produces a second current signal;

the feedback signal is comprised of more of the first current signal than the second current signal during a first range of values of the I/O differential output signal; and the feedback signal is comprised of a more of the second current signal than the first current signal during a second range of value of the I/O differential output signal.

* * * * *

UNITED STATES PATENT AND TRADEMARK OFFICE
CERTIFICATE OF CORRECTION

PATENT NO. : 6,873,194 B2
DATED : March 29, 2005
INVENTOR(S) : Ka Lun Choi

It is certified that error appears in the above-identified patent and that said Letters Patent is hereby corrected as shown below:

Column 1,
Line 10, replace "20022006538" with -- 6,864,723 --.
Line 44, delete the comma after "The".

Signed and Sealed this

Sixth Day of September, 2005

JON W. DUDAS
*Director of the United States Patent and Trademark Office*